United States Patent [19]

Takeuchi et al.

[11] Patent Number: 5,116,031
[45] Date of Patent: May 26, 1992

[54] CLAMPING DEVICE FOR BONDING MACHINES

[75] Inventors: Takashi Takeuchi; Takeyuki Nakagawa, both of Tokyo, Japan

[73] Assignee: Kabushiki Kaisha Shinkawa, Tokyo, Japan

[21] Appl. No.: 711,924

[22] Filed: Jun. 7, 1991

[30] Foreign Application Priority Data

Jun. 8, 1990 [JP] Japan .................................. 2-150697

[51] Int. Cl.⁵ .............................................. B25B 1/00
[52] U.S. Cl. ..................................... 269/87.3; 269/283
[58] Field of Search .................... 228/4.5, 105; 29/854, 29/748; 269/283, 284, 49, 309, 20, 25, 87.2, 87.3

[56] References Cited

U.S. PATENT DOCUMENTS

| | | | |
|---|---|---|---|
| 4,175,734 | 11/1979 | Williams | 269/49 |
| 4,265,436 | 5/1981 | Wagster et al. | 269/283 |
| 4,577,847 | 3/1986 | Schedwin | 269/309 |
| 4,583,676 | 4/1986 | Pena et al. | 228/4.5 |
| 5,035,034 | 7/1991 | Cotney | 228/4.5 |

Primary Examiner—Robert C. Watson
Attorney, Agent, or Firm—Koda and Androlia

[57] ABSTRACT

A clamping device for bonding machines used in manufacturing semiconductors including a clamp receiver, a rotatable lock key movable in a vertical direction on the clamp receiver, an air cylinder which pulls up and down the lock key, and a clamp which has a bonding window for bonding tool and an opening for the lock key passing through it. The clamp is mounted on the clamp receiver by letting the lock key pass through the opening, and then the lock key is turned so as not to accord with the opening. When the air cylinder is actuated, the lock key is pulled down and presses the clamp against the clamp receiver, securely positioning the clamp on the clamp receiver. Thus, the changing operation of the clamp is easily and quickly performed because the clamp can be removed by merely rotating the lock key and turning on and off the air cylinder.

3 Claims, 1 Drawing Sheet

CLAMPING DEVICE FOR BONDING MACHINES

BACKGROUND OF THE INVENTION

1. Field of the Invention

This invention relates to a device for manufacturing semiconductors, and more particularly to a clamping device used in a wire bonding machine or die bonding machine.

2. Prior Art

In bonding machines, bonding is carried out while a lead flame is pressed against a heating block by a clamp. The clamp has a bonding window which is large enough for a bonding tool passing through to reach semiconductor devices on a lead frame. When the lead frame is changed to another type, the clamp must also be changed so that the bonding window of the clamp matches the changed lead flame.

In a conventional clamping device, a clamp is positionally fixed on a support by means of screws such that the support allows the clamp to move vertically. An example of this type of device is described in Japanese Utility Model Publication No. 57-54278. However, in this conventional clamping device, since the clamp is positionally fixed by screws on a clamp receiver, the changing operation of the clamp is hard and takes a long time.

SUMMARY OF THE INVENTION

Accordingly, it is a primary object of this invention to overcome the above described disadvantage of the prior art devices. More specifically, the object of the present invention is to provide a clamping device for a wire bonding machine or a die bonding machine which allows quick and easy replacement of a clamp.

The above mentioned objects of the present invention are achieved by a unique structure wherein a clamp receiver is driven in a vertical direction, and a rotatable lock key which secures a clamp on the clamp receiver is provided movably in a vertical direction. A pressure loading means urges the lock key downwardly, and the clamp, which has a bonding window for a bonding tool and an opening for the lock key passing therethrough, is positionally secured on the clamp receiver by the downwardly urged lock key.

With the structure above, when the pressure loading means releases the lock key, the lock key is moved upward so that the clamp is free from the clamp receiver. Then, the lock key is turned to fit into the opening provided in the clamp. Thus, the clamp can be removed from the clamp receiver.

When another or new clamp is mounted on the clamp receiver, the new clamp is positioned on the clamp receiver, so that the opening provided in the new clamp passes through the lock key. Then, the lock key is turned so as to engage with a shoulder portion of the opening (or the top surface) of the new clamp and the lock key is urged downwardly by the pressure loading means. Consequently, the new clamp is easily positioned and secured on the clamp receiver.

As described above, the changing operation of clamp is easily and quickly taken because the clamp can be replaced by merely turning and moving the lock key in the vertical direction.

BRIEF DESCRIPTION OF THE DRAWINGS

The accompanying drawings illustrate one embodiment of the clamping device of the present invention, wherein.

DETAILED DESCRIPTION OF THE INVENTION

A detailed description of the embodiment of the present invention will be given below with reference to the drawings.

Figure 2:
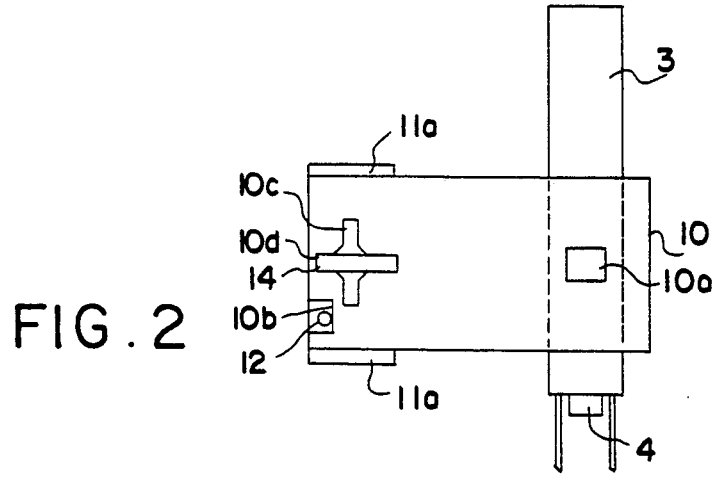
FIG. 2 is a top view thereof.
Figure 3:
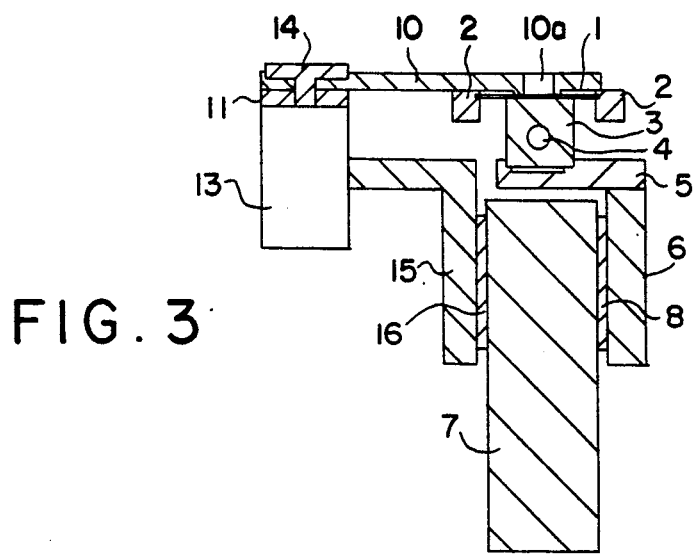
FIG. 3 is a sectional view thereof.

As seen in FIGS. 2 and 3, a heating block 3 including a heater 4 is provided on a support stand 5 for heating a lead frame 1. The lead frame 1 is guided by a guide frame 2 and intermittently transferred by a transfer means (not shown). The heater stand 5 is provided on a heater guide 6 and driven up and down by a drive means (not shown). The heater guide 6 is vertically movable on a fixing stand 7 via bearing 8.

Figure 1:
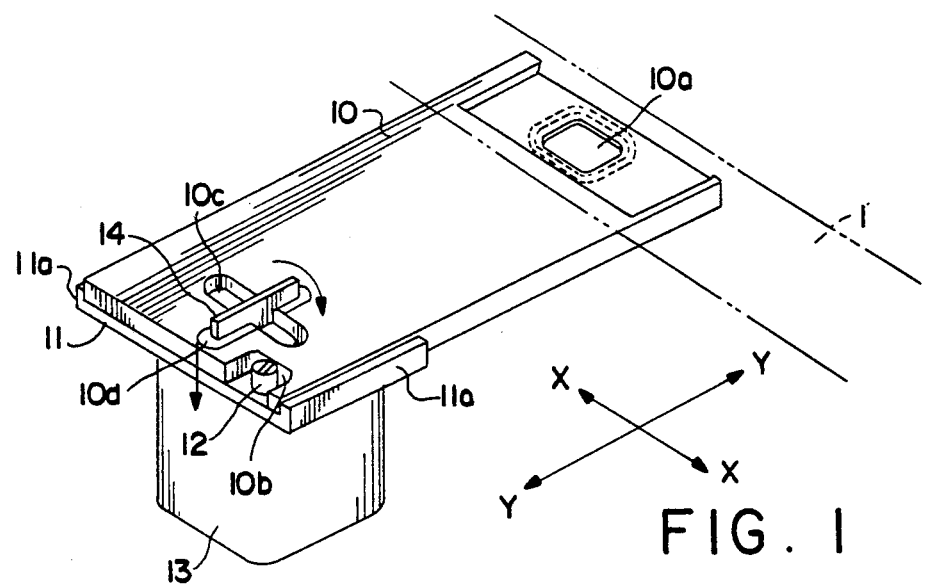
FIG. 1 is a perspective view of the clamping device.

A clamp 10 used to push the lead frame 1 against the heating block 3 has a bonding window 10a at one end (see FIG. 2) and, as shown in FIG. 1, a cut-out portion 10b, an opening 10c, and an indentation 10d (described later) on the other end. The clamp 10 is positioned on a clamp receiver 11. In particular, the clamp receiver 11 has two projecting guides 11a on the both sides that fit on each side of the clamp 10. When the clamp 10 is mounted on the clamp receiver 11, the X direction of the clamp 10 is inevitably determined by the projecting guides 11a.

Furthermore, an eccentric shaft 12, rotatably provided on the clamp receiver 11, is in contact with the edge of the cut-out portion 10b. The Y direction of the clamp 10 is thus determined by the eccentric shaft 12.

An air cylinder 13 for locking the clamp 10 is provided on the undersurface of the clamp receiver 11. A lock key 14 is installed on the edge of a moving rod of the air cylinder 13.

The opening 10c shaped substantially rectangular (longer side in the X direction) is large enough for the lock key 14 to pass through. The indentation 10d in a rectangular shape (longer side in the Y direction) crosses the rectangular opening 10c at substantially right angles such that when the lock key is placed in the indentation 10d, the lock key 14 is restricted its rotation.

The air cylinder 13 is mounted on a clamp guide 15 driven in the vertical direction by a vertical direction movement mechanism (not shown). The clamp guide 15 is movable in a vertical direction on a fixing stand 7 by means of a bearing 16.

Next, the operation of the above-described device will be explained with reference to an example to change the clamp 10.

First, when the air cylinder 13 is not actuated, the lock key 14 installed on the edge of the moving rod of the air cylinder 13 is positioned at its highest level, allowing the clamp 10 to be released from the clamp receiver 11.

Thus, when the lock key 14 is turned 90° so as to accord with the opening 10c of the clamp 10, the clamp 10 can be removed from the clamp receiver 11 by raising the clamp 10.

Thereafter, another clamp to be replaced ("new clamp") which has a different shape bonding window 10a is mounted on the clamp receiver 11 so that the opening 10c of the new clamp passes through the lock key 14 and the edge of the cut-out portion 10b of the new clamp is brought into contact with the eccentric shaft 12. The X and Y directions of the replaced clamp is thus determined. In such a condition, the new clamp is mounted on the clamp receiver 11.

Next, the lock key 14 is turned 90° (as indicated by the curved arrow in FIG. 1) so as to position above the indentation 10d of the new clamp. Then, the air cylinder 13 is actuated, and the lock key 14 is driven downwardly and fits in the indentation 10d of the new clamp, pressing the indentation 10d against the clamp receiver 11. Thus, the new clamp is positionally secured on the clamp receiver 11 by the suction pressure generated by the air cylinder 13 being activated, and bonding is performed with this new clamp.

In the embodiment described above, the lock key 14 is driven downwardly and upwardly by the air cylinder 13. However, it is also possible to drive the lock key 14 by a solenoid valve. Moreover, instead of providing the lock key 14 on the air cylinder 13, it is also possible to directly provide the lock key 14 rotatably and movably in the vertical direction on the clamp receiver so as to be urged downwardly by a lever biased by a spring. In addition, though the X direction guides 11a and the eccentric shaft 12 are used for positioning of the clamp 10 on the clamp receiver 11, a combination of two or more pins provided on the clamp receiver 11 and holes which accord with the pins provided on the clamp 10 can be used so as to mount the clamp 10 on the clamp receiver 11 with the pins passed through the holes.

Furthermore, the shapes of the opening and indentation are not limited to rectangular as in the above embodiment. They can be in any shape as far as they match the shape of the lock key so that the lock key can pass through the opening and can engage with the indentation. In addition, any means (such as projections) can be used instead of the indentation to restrict the rotation of the lock key when the lock key is pressing the clamp against the clamp receiver.

As is clear from the above, a changing operation of a clamp is easily and quickly accomplished because the clamp can be replaced by turning and moving the lock key in the vertical direction.

We claim:

1. A clamping device for bonding a lead frame characterized in that said device comprises:
    a clamp receiver which is driven upwardly and downwardly;
    a rotatable lock key provided movably in a vertical direction on said clamp receiver, said lock key being rotatable between a lock and an unlock positions;
    a lock key pressure loading means which urges said lock key downwardly when said lock key is rotated to said lock position; and
    a clamp which has a bonding window and an opening through which said lock key is passed when said lock key is in said unlock position and an indentation for engagement with said lock key when said lock key is in said lock position so that said clamp mounted on said clamp receiver is positionally secured by said lock key being rotated to said lock position.

2. A clamping device according to claim 1 wherein both said lock key and said indentation are rectangular in shape and said indentation is longer than said lock key.

3. A clamping device according to claim 2, further comprising a cut-out provided in an edge of said clamp and an eccentric shaft means provided on said clamp receiver which engages with one edge of said cut-out whereby a position of said clamp on said clamp receiver is adjusted by rotating said eccentric shaft means.

* * * * *